(12) United States Patent
Isaji et al.

(10) Patent No.: US 11,811,209 B2
(45) Date of Patent: Nov. 7, 2023

(54) CIRCUIT STRUCTURE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yusuke Isaji, Mie (JP); Ryoya Okamoto, Mie (JP); Hiroshi Shimizu, Mie (JP); Hitoshi Takeda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 374 days.

(21) Appl. No.: 17/299,460

(22) PCT Filed: Nov. 20, 2019

(86) PCT No.: PCT/JP2019/045420
§ 371 (c)(1),
(2) Date: Jun. 3, 2021

(87) PCT Pub. No.: WO2020/116162
PCT Pub. Date: Jun. 11, 2020

(65) Prior Publication Data
US 2022/0029399 A1    Jan. 27, 2022

(30) Foreign Application Priority Data
Dec. 6, 2018   (JP) .................. 2018-229199

(51) Int. Cl.
*H02G 3/16*  (2006.01)
*H01R 4/38*  (2006.01)
*H01R 4/58*  (2006.01)

(52) U.S. Cl.
CPC .............. *H02G 3/16* (2013.01); *H01R 4/38* (2013.01); *H01R 4/58* (2013.01)

(58) Field of Classification Search
CPC .. H02G 3/16; H02G 3/32; H02G 5/00; H02G 3/08; H02G 3/081; H01R 4/38;
(Continued)

(56) References Cited

U.S. PATENT DOCUMENTS 4,210,379 A * 7/1980 Vachhani ............. H01R 9/2408
439/406
6,464,538 B2 * 10/2002 Miyazaki ........... H01R 13/6589
439/95
(Continued)

FOREIGN PATENT DOCUMENTS

JP       58-005290       1/1983
JP       2003-125517     4/2003
(Continued)

OTHER PUBLICATIONS

Official Communication issued in International Bureau of WIPO Patent Application No. PCT/JP2019/045420, dated Dec. 24, 2019, along with an English translation thereof.

*Primary Examiner* — Angel R Estrada
(74) *Attorney, Agent, or Firm* — GREENBLUM & BERNSTEIN, P.L.C.

(57) ABSTRACT

A circuit structure includes: an upper case having positioning holes; bus bars that are provided in an inductor disposed in the upper case and that have through holes; terminals that are connected to electric wires and that have bolts disposed thereon that penetrate the through holes; nuts that sandwich the bus bars between the nuts and the terminals by being screwed onto the bolts; and a lower case that is attached to the upper case. The lower case includes: front walls, left walls, and right walls that project upward from the lower case and position the terminals relative to the lower case by coming into contact with the terminals; and case positioning
(Continued)

portions that project upward from the lower case and that are inserted into the positioning holes.

4 Claims, 14 Drawing Sheets

(58) Field of Classification Search
CPC . H01R 4/58; H01R 13/42; H01R 4/42; H01R 4/44; H01R 4/46; H01R 4/56; H01R 9/16; H01R 9/22; H01R 9/18; H05K 7/06; H05K 7/00; H05K 7/02; H05K 7/14; H05K 7/1417
USPC ........... 174/59, 60, 50, 520, 535, 549, 71 B, 174/72 B, 559; 439/76.1, 76.2, 661, 662, 439/663, 364, 363, 949; 361/600, 601, 361/611, 641
See application file for complete search history.

(56) References Cited

U.S. PATENT DOCUMENTS

| | | | |
|---|---|---|---|
| 6,948,982 B2 | 9/2005 | Higuchi et al. | |
| 7,442,099 B2 * | 10/2008 | Egawa | H01R 9/24 |
| | | | 439/76.2 |
| 7,611,360 B2 | 11/2009 | Akahori et al. | |
| 7,632,148 B1 * | 12/2009 | Kawamura | H01R 13/5221 |
| | | | 439/607.41 |
| 7,914,300 B2 * | 3/2011 | Akahori | H01R 4/34 |
| | | | 439/76.2 |
| 8,672,700 B2 | 3/2014 | Matsumoto et al. | |
| 9,425,018 B2 * | 8/2016 | Nohara | H01H 85/201 |
| 9,912,091 B1 * | 3/2018 | Miyazawa | H01R 13/422 |
| 10,131,297 B1 * | 11/2018 | Kakimi | B60R 16/0238 |
| 10,243,283 B2 * | 3/2019 | Nagano | H01R 4/305 |
| 10,505,355 B2 * | 12/2019 | Matsuura | H02G 3/14 |
| 10,638,621 B1 * | 4/2020 | Alexander | H05K 5/0069 |
| 10,686,261 B2 * | 6/2020 | Matsuura | H02G 3/16 |
| 11,545,766 B2 * | 1/2023 | Nagata | H01R 9/24 |
| 2004/0115991 A1 | 6/2004 | Higuchi et al. | |
| 2009/0253294 A1 | 10/2009 | Akahori et al. | |
| 2012/0238147 A1 | 9/2012 | Matsumoto et al. | |

FOREIGN PATENT DOCUMENTS

| | | |
|---|---|---|
| JP | 2004-048862 | 2/2004 |
| JP | 2009-254072 | 10/2009 |
| JP | 2013-502025 | 1/2013 |
| JP | 2013-234856 | 11/2013 |

* cited by examiner

CIRCUIT STRUCTURE

TECHNICAL FIELD

The technique disclosed in the present specification relates to a circuit structure.

BACKGROUND ART

The following configuration is known as a conventional example of a circuit structure that includes a first conductive member provided in a device and a second conductive member connected to the first conductive member. The first conductive member and the second conductive member are connected by a connection screw and a nut in a state in which one end of the second conductive member is placed over the first conductive member provided in the device. The other end of the second conductive member is placed over a terminal block having a nut attached thereto, and is fixed to the terminal block by a connection screw and the nut. Thus, the device, the first conductive member, the second conductive member, and the terminal block are electrically connected.

The circuit structure disclosed in JP 2013-234856A is an example of the above-described circuit structure.

CITATION LIST

Patent Documents

Patent Document 1: JP 2013-234856A

SUMMARY OF INVENTION

Technical Problem

According to the above-described technique, there was a problem in that the positioning of the first conductive member, the second conductive member, and the terminal block relative to one another was troublesome. This will be described below.

Through holes that are penetrated by a connection screw are provided in the first conductive member and one end of the second conductive member. Even if an attempt is made to align the through hole in the first conductive member and the through hole in the second conductive member, it is difficult to directly see the through hole in the first conductive member since the first conductive member is hidden beneath the second conductive member. Even if looking downward through the through hole provided in the second conductive member, it would still be difficult to position the first conductive member and the second conductive member relative to one another since the range that can be seen through the through hole is extremely narrow.

A similar situation may occur at the portion where the other end of the second conductive member and the terminal block are fixed to one another by a connection screw and a nut. It is difficult to directly see the terminal block since the terminal block is hidden beneath the second conductive member, and it is not easy to check the position of the terminal block from the narrow range that can be seen through a through hole provided in the other end of the second conductive member.

Furthermore, a gap within the range of tolerance of the components forming the circuit structure may be formed between the other end of the second conductive member and the terminal block. The other end of the second conductive member and the terminal block are fixed to one another by a connection screw and the nut attached to the terminal block. This nut is fixed to the terminal block. Due to this, if the connection screw is screwed into the nut in a state in which a gap is formed between the other end of the second conductive member and the terminal block, there is a concern that both or one of the second conductive member and the terminal block may warp. This warping may produce a defect in the terminal block. Furthermore, if the second conductive member warps, the warping may be transmitted to the device from the first conductive member and may produce a defect in the device.

In order to address the above-described problems, it is conceivable that the second conductive member and the terminal block are positioned relative to one another by increasing the dimensional accuracy of the components forming the circuit structure. However, this method increases the manufacturing cost of the circuit structure, and thus is not practical.

The technique disclosed in the present specification has been contrived on the basis of the above-described circumstances, and aims to provide a circuit structure in which positioning during assembly is simplified.

Solution to Problem

The technique disclosed in the present specification is a circuit structure including: an upper case having positioning holes; a bus bar that is provided in a device disposed in the upper case and that has a through hole; a terminal that is connected to an electric wire and that has a bolt disposed thereon that penetrates the through hole; a nut that sandwiches the bus bar between the nut and the terminal by being screwed onto the bolt; and a lower case that is attached to the upper case, wherein the lower case includes: a terminal positioning portion that projects upward from the lower case and positions the terminal relative to the lower case by coming into contact with the terminal; and case positioning portions that project upward from the lower case and that are inserted into the positioning holes.

According to the above-described configuration, the terminal and the lower case can be positioned relative to one another by bringing the terminal into contact with the terminal positioning portion.

Furthermore, the lower case and the upper case can be positioned relative to one another by inserting the case positioning portions of the lower case into the positioning holes in the upper case. Thus, the bolt of the terminal that has been positioned relative to the lower case and the through hole in the bus bar provided in the device disposed in the upper case can be easily positioned relative to one another.

By screwing the nut onto the bolt in a state in which the bolt penetrates the through hole, the terminal and the nut move relatively closer to one another. The terminal having the bolt disposed thereon can move easily since the terminal is connected to the electric wire. Thus, due to the terminal moving, the terminal and the bus bar can be fastened using a bolt while suppressing warping of the bus bar and the terminal, even if a gap is formed between the bus bar and the terminal. Consequently, the positioning of the terminal and the bus bar relative to one another can be easily performed without increasing the dimensional accuracy of the components forming the circuit structure.

The following aspects are preferable as embodiments of the technique disclosed in the present specification.

In a state in which the nut has been screwed onto the bolt and the bus bar has been sandwiched between the nut and the terminal, the terminal is separated from the terminal positioning portion.

According to the above-described configuration, a situation in which abnormal noise is generated by the terminal and the terminal positioning portion coming into contact with each other due to vibration can be suppressed.

The lower case has locking portions projecting from the lower case, and the locking portions have facing portions that face the terminal.

According to the above-described configuration, the terminal and the facing portions come into contact with each other if the terminal receives a force in the direction away from the lower case. Thus, the terminal is suppressed from moving higher than the position where the facing portions are provided.

A tapered surface is formed at a hole edge portion of the through hole on a surface of the bus bar that faces the terminal.

According to the above-described configuration, the bolt is guided to the inside of the through hole due to the tip of the bolt contacting the tapered surface. Thus, the terminal and the bus bar can be more easily positioned relative to one another.

Advantageous Effects of Invention

The technique disclosed in the present specification can simplify positioning during assembly of a circuit structure.

DESCRIPTION OF EMBODIMENTS

Embodiment 1

Embodiment 1 of the technique disclosed in the present specification will be described with reference to FIGS. 1 to 14. A circuit structure 10 pertaining to the present embodiment is mounted in a vehicle (not illustrated) such as an electric automobile or a hybrid vehicle, and conducts or cuts off electricity from a power source to one or more onboard electrical components. In the following description, the Z direction is regarded as the top side, the Y direction is regarded as the front side, and the X direction is regarded as the left side. Note that when the same member is provided in a plurality, the reference symbol therefor may be provided to some of the members and may be omitted for the rest.

Circuit Structure 10

Figure 1:
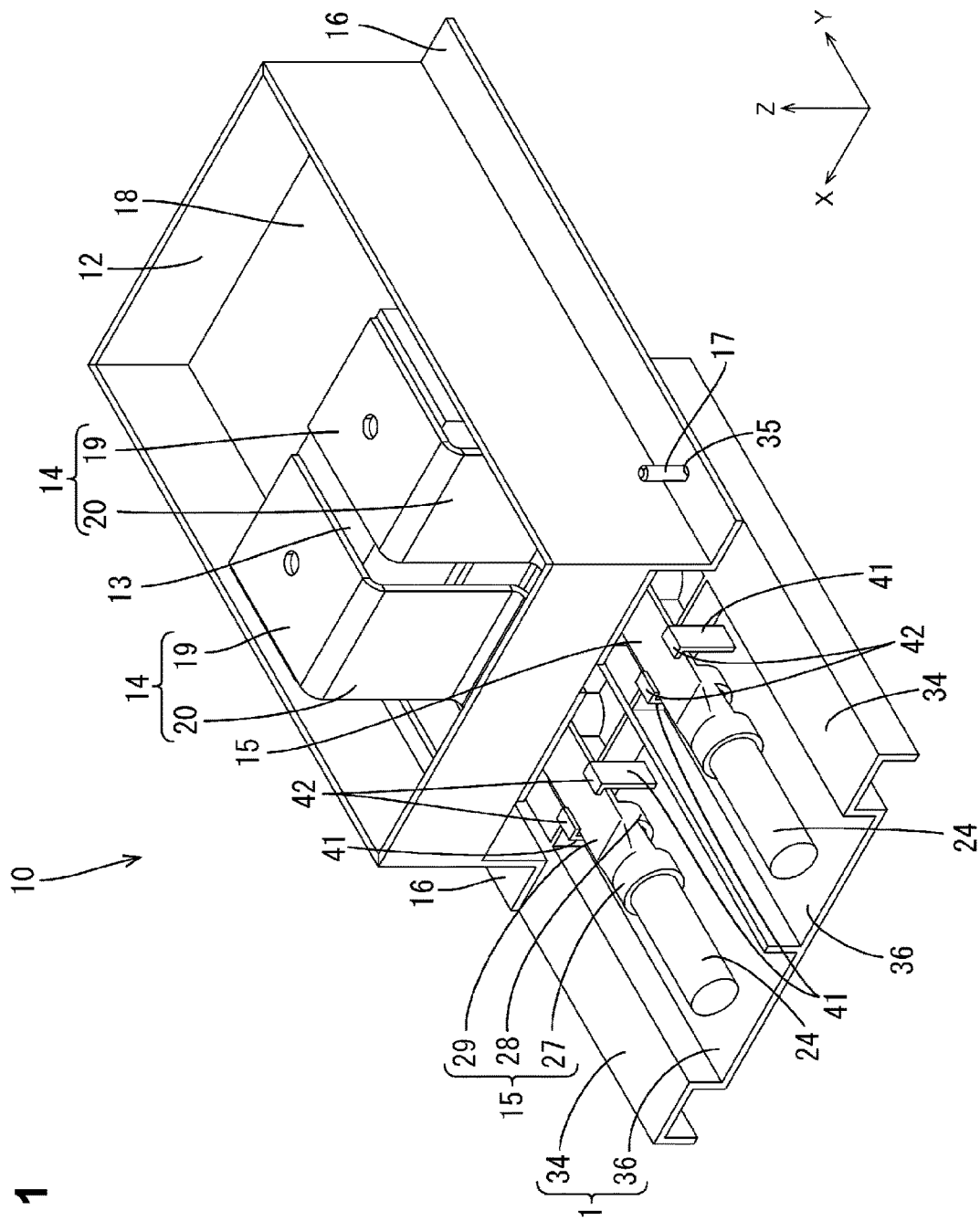
FIG. 1 is a perspective view illustrating a circuit structure pertaining to embodiment 1.
Figure 2:
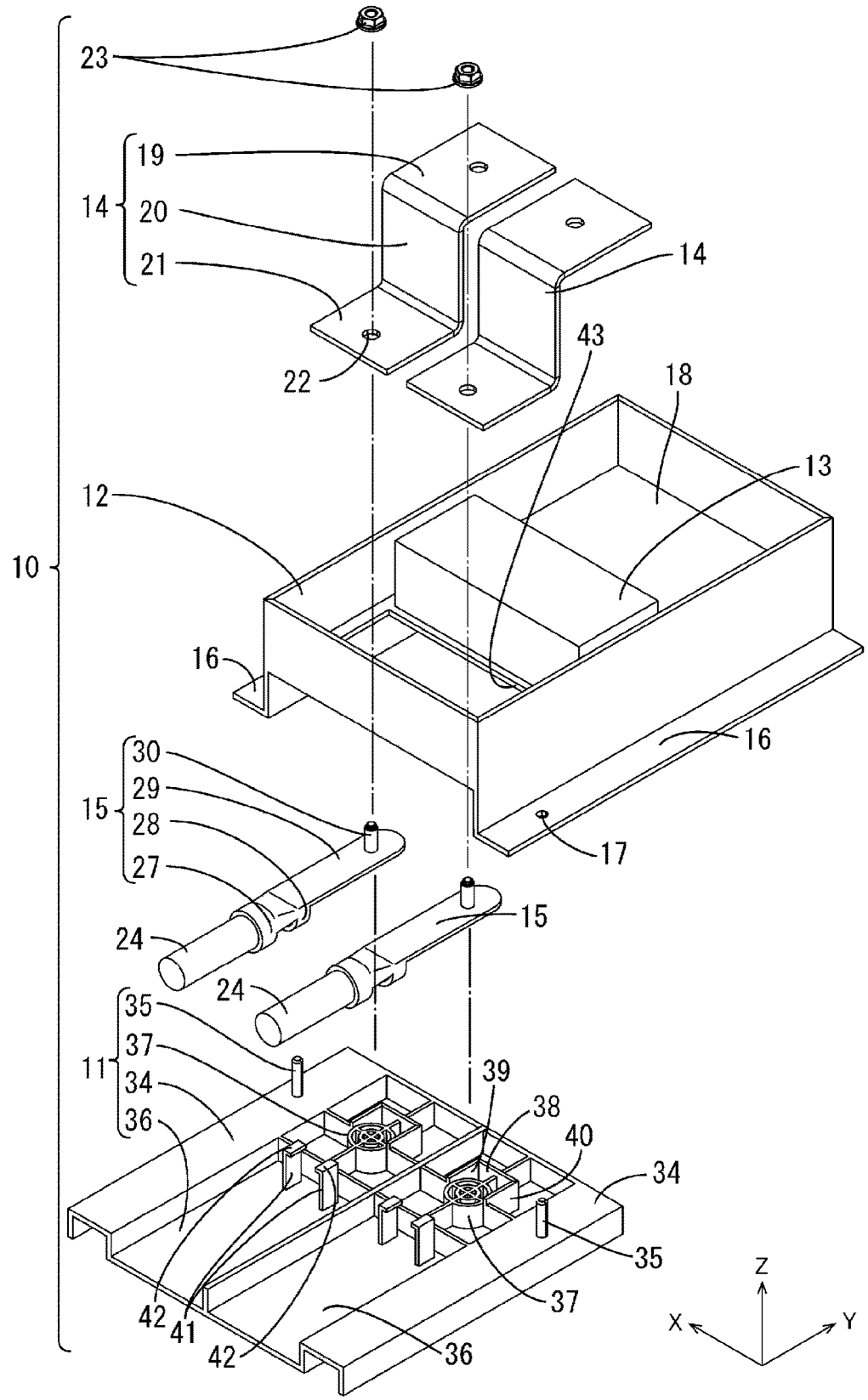
FIG. 2 is an exploded perspective view illustrating the circuit structure.

As illustrated in FIGS. 1 and 2, the circuit structure 10 includes a lower case 11, an upper case 12 that is attached to the lower case 11 from above, bus bars 14 that are provided in an inductor 13 (one example of a device) that is disposed in the upper case 12, and terminals 15 that are electrically connected to the bus bars 14.

Upper Case 12

The upper case 12 is made of a metal, and is formed into a predetermined shape using a known method such as welding, die casting, or casting. A known material such as aluminum, an aluminum alloy, or stainless steel can be chosen, as appropriate, as the metal for forming the upper case 12.

The upper case 12 is open in the top-bottom direction and has the shape of a frame extending in the front-rear direction when seem from above. The upper case 12 has four side walls. Flanges 16 that project outward in the left-right direction are provided at the bottom end edges of the left and right side walls. At a position near the rear end of each flange 16, a positioning hole 17 that penetrates the flange 16 in the top-bottom direction is provided. The positioning hole 17 has a circular cross-section.

As illustrated in FIG. 2, the upper case 12 is provided with a base portion 18 that connects the left side wall, the right side wall, and the rear wall. The base portion 18 has the shape of a plate that is flat in the top-bottom direction. The inductor 13 is disposed on the base portion 18 using a known method such as screwing. A bus-bar insertion hole 43 into which the bus bars 14 are inserted is formed so as to penetrate the base portion 18 between the rear end edge of the base portion 18 and the rear wall of the upper case 12.

The inductor 13 is a coil, a relay, a transformer, or the like, and includes a coil inside. As a whole, the inductor 13 has the shape of a cuboid. A plurality of bus bars 14 (two in the present embodiment) are electrically connected to the top surface of the inductor 13.

The bus bars 14 are obtained by pressing and forming metal sheets into a predetermined shape A desired metal such as copper, a copper alloy, aluminum, or an aluminum alloy can be chosen, as appropriate, as the metal for forming the bus bars 14. The bus bars 14 are bent in a crank shape when seen from the left-right direction, and include a top plate portion 19, a side plate portion 20 that extends downward from the rear end edge of the top plate portion 19, and a bottom plate portion 21 that extends rearward from the bottom end edge of the side plate portion 20 (see FIG. 2).

The top plate portions 19 of the bus bars 14 are connected to the inductor 13 using a known method such as screwing, welding, or soldering, in a state in which the top plate portions 19 are placed over the top surface of the inductor 13. The side plate portions 20 of the bus bars 14 extend downward along the rear wall of the inductor 13. In the bottom plate portions 21 of the bus bars 14, through holes 22 penetrating the bottom plate portions 21 in the top-bottom direction are provided. On the bottom surface of each bottom plate portion 21, a tapered surface 23, which has a diameter that expands downward, is formed at the hole edge portion of the through hole 22 (see FIG. 10).

Terminals 15

Figure 3:
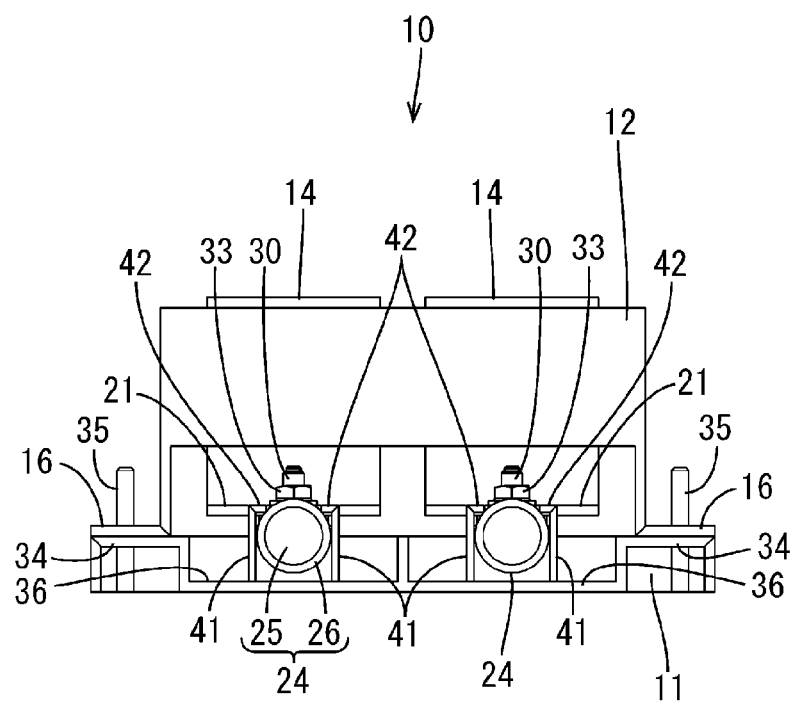
FIG. 3 is a rear view illustrating the circuit structure.
Figure 4:
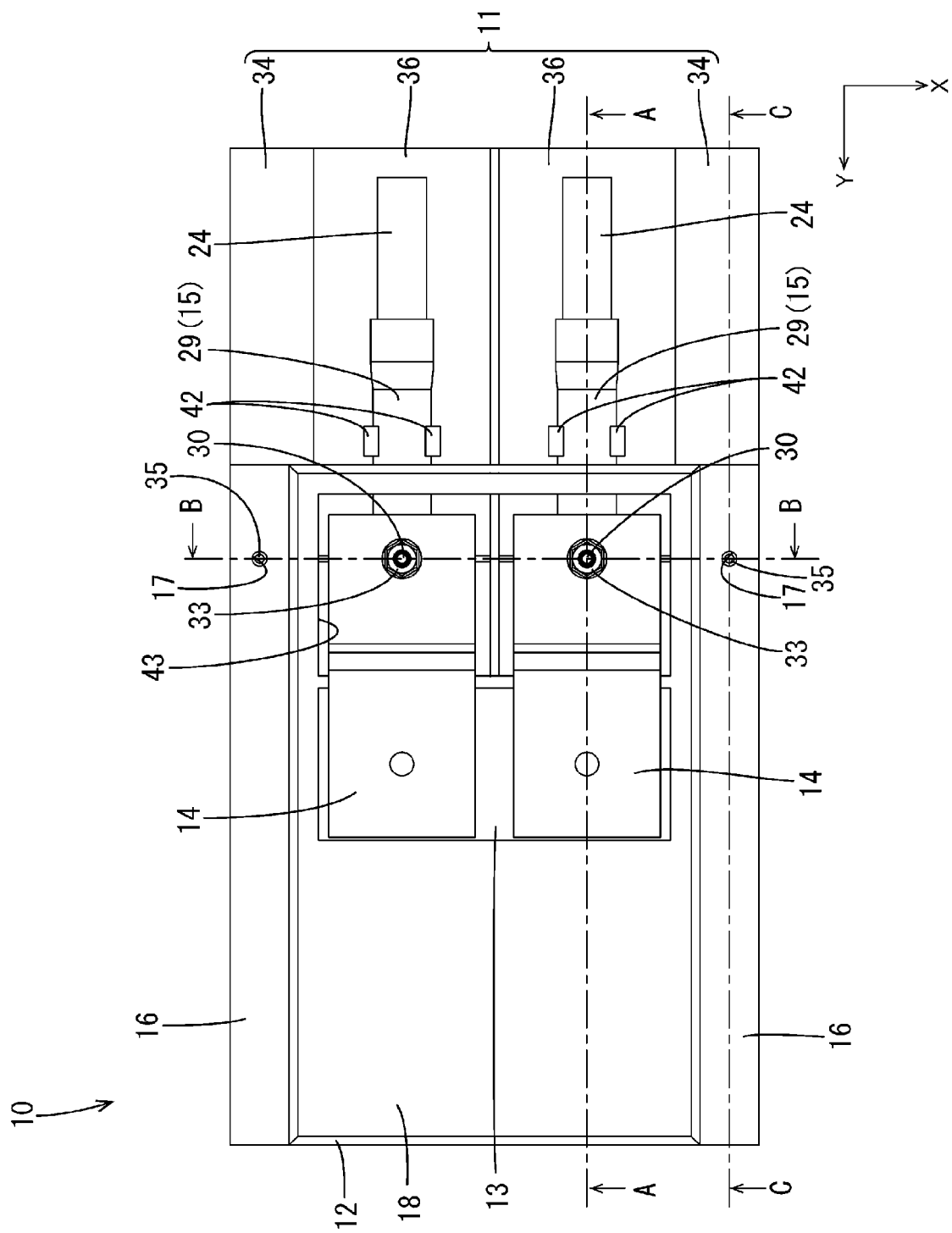
FIG. 4 is a plan view illustrating the circuit structure.

As illustrated in FIG. 2, the terminals 15 are connected to front ends of electric wires 24. Furthermore, as illustrated in FIG. 3, the electric wires 24 include a metal core wire 25 and an insulation coating 26 that covers the outer circumference of the core wire 25. A desired metal such as copper, a copper alloy, aluminum, or an aluminum alloy can be chosen, as appropriate, as the metal for forming the core wire 25. The insulation coating 26 is made of a synthetic resin having an insulating property.

Figure 7:
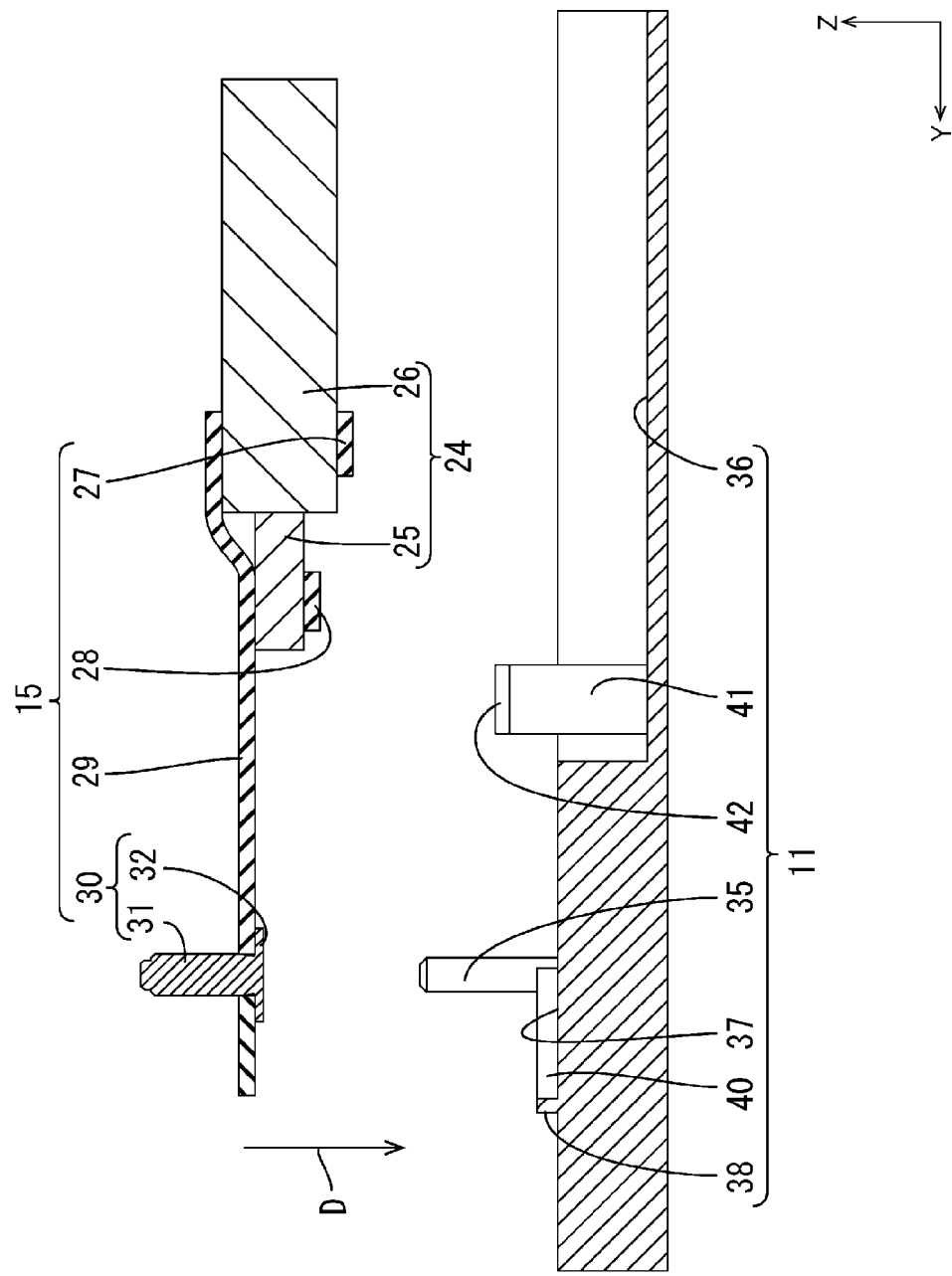
FIG. 7 is a cross-sectional view cut along a line corresponding to line A-A in FIG. 4, illustrating a process of attaching, to the lower case, terminals connected to electric wires.
Figure 8:
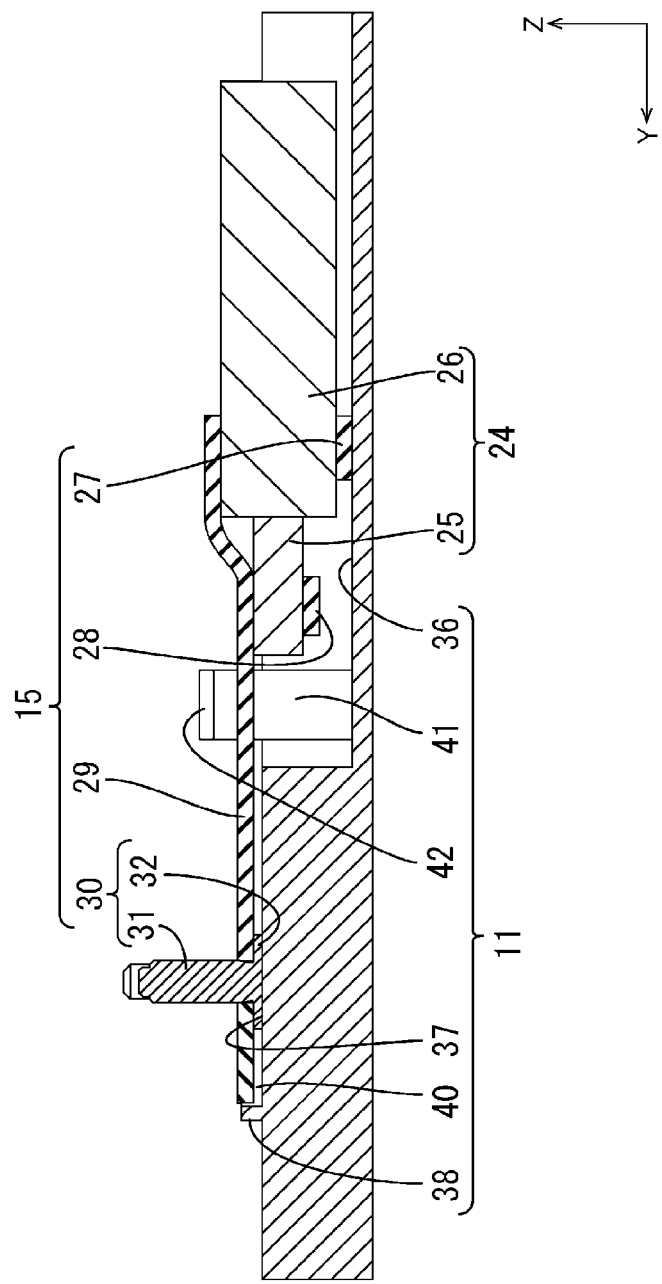
FIG. 8 is a cross-sectional view cut along a line corresponding to line A-A in FIG. 4, illustrating a state in which the terminals connected to the electric wires have been mounted onto the lower case.
Figure 9:
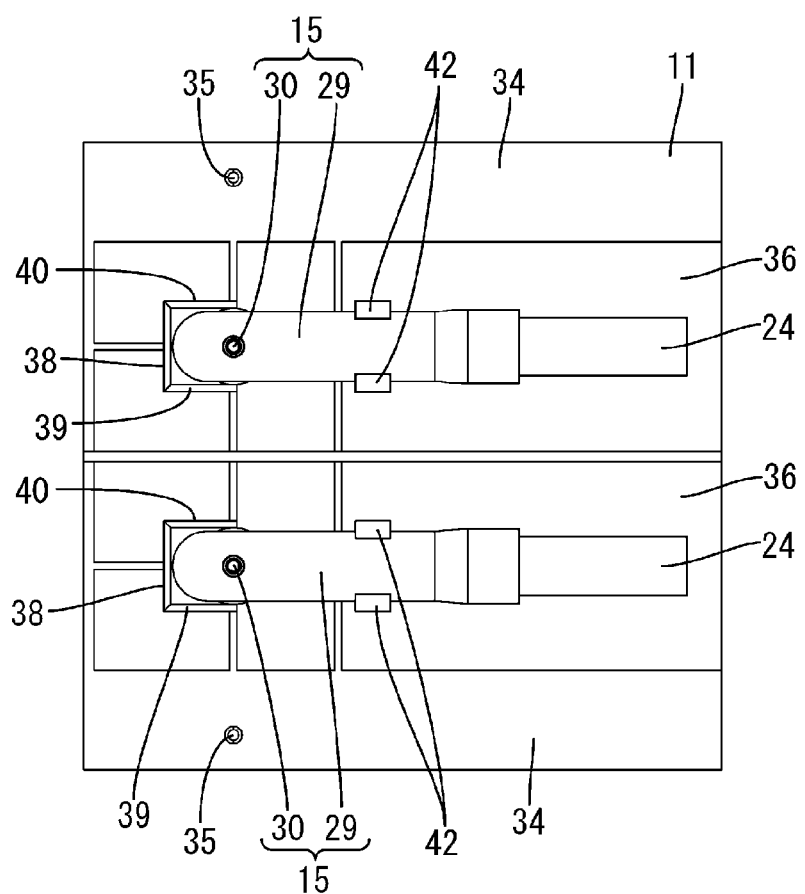
FIG. 9 is a plan view illustrating the state in which the terminals connected to the electric wires have been mounted onto the lower case.

As illustrated in FIG. 7, the terminals 15 include: an insulation barrel 27 that is crimped onto the insulation coating 26 from the outside so as to wrap around the insulation coating 26; a wire barrel 28 that is contiguous from the front side of the insulation barrel 27 and that is crimped onto the core wire 25 from the outside so as to wrap around the core wire 25; a plate portion 29 that has the shape of an elongated plate, on the front side of the wire barrel 28; and a bolt 30 that is disposed at a position near the front end of the plate portion 29. The plate portion 29 has the shape of a tab with a rounded front end.

The bolt 30 includes a shaft portion 31 that extends in the top-bottom direction, and a fixing portion 32 that is provided at the bottom end of the shaft portion 31 and that is attached to the plate portion 29 using a known method such as welding or press-fitting. The shaft portion 31 has the shape of a round bar or circular column extending in the top-bottom direction. A screw thread is formed on the outer circumference of the shaft portion 31. The fixing portion 32 is formed to have a larger diameter than the shaft portion 31.

The bolt 30 pertaining to the present embodiment is fixed to a terminal 15 by inserting the shaft portion 31 from below into a bolt through hole formed in the plate portion 29, and welding the hole edge portion of the bolt through hole and the fixing portion 32 together.

Nuts 33

Figure 5:
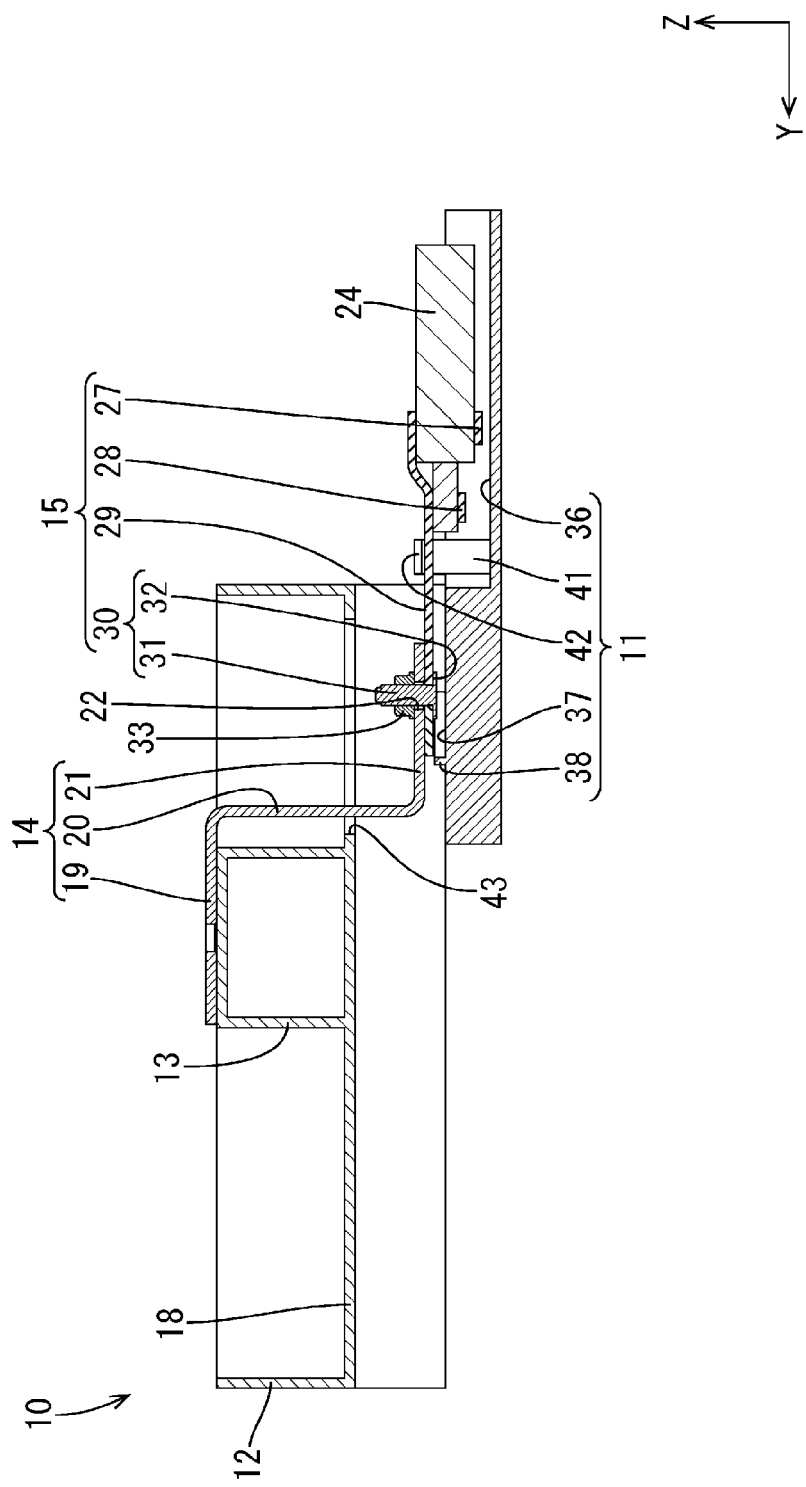
FIG. 5 is a cross-sectional view along line A-A in FIG. 4.

As illustrated in FIGS. 3 and 5, nuts 33 are screwed onto the shaft portions 31 of the bolts 30. The nuts 33 and the plate portions 29 move relatively closer to one another due to the nuts 33 being screwed onto the shaft portions 31.

Lower Case 11

The lower case 11 is formed by injection-molding a synthetic resin having an insulating property. As a whole, the lower case 11 has a flat shape in the top-bottom direction. On the top surface of the lower case 11, flange mounting portions 34 on which the flanges 16 of the upper case 12 are mounted from above are provided at positions near both ends on the left and the right. The width in the left-right direction of each flange mounting portion 34 is set to be larger than the width in the left-right direction of the flanges 16.

Figure 6:
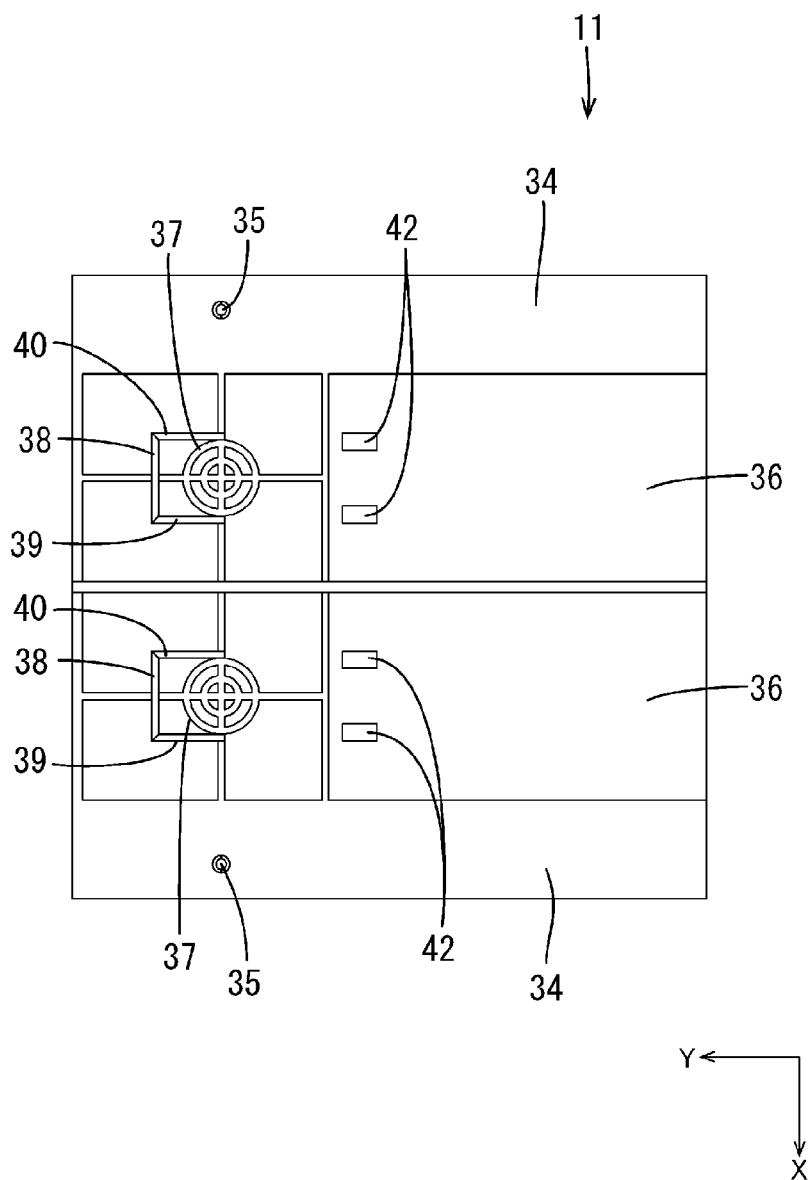
FIG. 6 is a plan view illustrating a lower case.

As illustrated in FIG. 6, case positioning portions 35 that project upward are formed at positions near the front ends of the flange mounting portions 34. The case positioning portions 35 have the shape of a circular column elongated in the top-bottom direction. The outer dimension of the case positioning portions 35 is set to be the same as or smaller than the inner diameter dimension of the positioning holes 17 provided in the flanges 16.

A plurality of (two in the present embodiment) electric wire mounting portions 36 that extend in the front-rear direction and that have a shape recessed downward from the flange mounting portions 34 are provided side by side in the left-right direction near the center in the left-right direction of the lower case 11. The electric wire mounting portions 36 are formed to extend rearward from positions slightly rearward of the front end of the lower case 11. Note that the plate portions 29 of the terminals 15 connected to the electric wires 24 are also arranged in the regions near the front ends of the electric wire mounting portions 36.

At positions on the front side of the electric wire mounting portions 36, terminal mounting portions 37 on which the plate portions 29 of the terminals 15 connected to the ends of the electric wires 24 can be mounted are provided. The terminal mounting portions 37 extend in the top-bottom direction, and have the shape of hollowed cylinders. The width in the left-right direction of the terminal mounting portions 37 is set to be the same as or slightly larger than the width in the left-right direction of the plate portions 29 of the terminals 15. As illustrated in FIG. 6, the center positions of the terminal mounting portions 37 and the case positioning portions 35 are arranged in approximately a single line in the left-right direction.

On the front side of each terminal mounting portion 37, a front wall 38 (one example of a terminal positioning portion) is formed to extend in the top-bottom direction. The width in the left-right direction of the front wall 38 is set to be slightly larger than the width in the left-right direction of the terminal mounting portion 37. A left wall 39 (one example of a terminal positioning portion) that extends rearward is provided at the left end of the front wall 38. A right wall 40 (one example of a terminal positioning portion) that extends rearward is provided at the right end of the front wall 38. The rear ends of the left wall 39 and the right wall 40 extend to the center portion in the front-rear direction of the terminal mounting portion 37. Seen from above, the front wall 38, the left wall 39, and the right wall 40 form the shape of a gate.

At a position that is rearward of the terminal mounting portion 37 and that is near the front end of an electric wire mounting portion 36, a pair of locking portions 41 projecting upward from the bottom wall of the electric wire mounting portion 36 are formed. The pair of locking portions 41 are formed side by side in the left-right direction. The spacing in the left-right direction between the pair of locking portions 41 is set to be the same as or slightly larger than the width in the left-right direction of the plate portions 29 of the terminals 15. The pair of locking portions 41 have the shape of plates extending in the top-bottom direction, and are formed to be elastically deformable in the left-right direction.

At the tips of the pair of locking portions 41, facing portions 42 projecting inward in the left-right direction are formed. In a state in which a terminal 15 is mounted on the terminal mounting portion 37, the facing portions 42 face the plate portion 29 of the terminal 15.

Assembly Process of Embodiment

Next, one example of an assembly process of the circuit structure 10 pertaining to the present embodiment will be described. The assembly process of the circuit structure 10 is not limited to that described below.

The fixing portions 32 of the bolts 30 are welded onto the plate portions 29 of the terminals 15 using a known welding method. The insulation coating 26 on the electric wires 24 is stripped to expose the core wires 25. The wire barrels 28 of the terminals 15 are crimped onto the exposed core wires 25, and the insulation barrels 27 are crimped onto the insulating coating 26.

The upper case 12 is formed using die-cast molding an aluminum alloy. The inductor 13 is attached to the base portion 18 of the upper case 12. The bus bars 14 are fixed to the inductor 13.

As illustrated in FIG. 7, from above (from the direction indicated by arrow D), the plate portions 29 of the terminals 15 are mounted on the terminal mounting portions 37 of the lower case 11 so that the bolts 30 face upward, and the electric wires 24 are mounted on the electric wire mounting portions 36. Here, the terminals 15 are arranged on the terminal mounting portions 37 so that the front ends of the plate portions 29 contact the front walls 38 from the rear side (see FIGS. 8 and 9). Thus, in a state before the nuts 33 are screwed onto the bolts 30, the plate portions 29 of the terminals 15 are mounted on the terminal mounting portions 37, and the electric wires 24 are mounted on the electric wire mounting portions 36.

The plate portions 29 and the left walls 39 and right walls 40 of the lower case 11 may be separated from one another or may be in contact with one another. Furthermore, after the terminals 15 are mounted on the terminal mounting portions 37 so that the front ends of the plate portions 29 of the terminals 15 contact the front walls 38 from the rear side, the plate portions 29 may be separated from the front walls 38 due to the electric wires 24 bending. Due to the plate portion 29 of each terminal 15 being arranged inside a space surrounded by a front wall 38, a left wall 39, and a right wall 40, the terminals 15 are positioned relative to the lower case 11.

Figure 10:
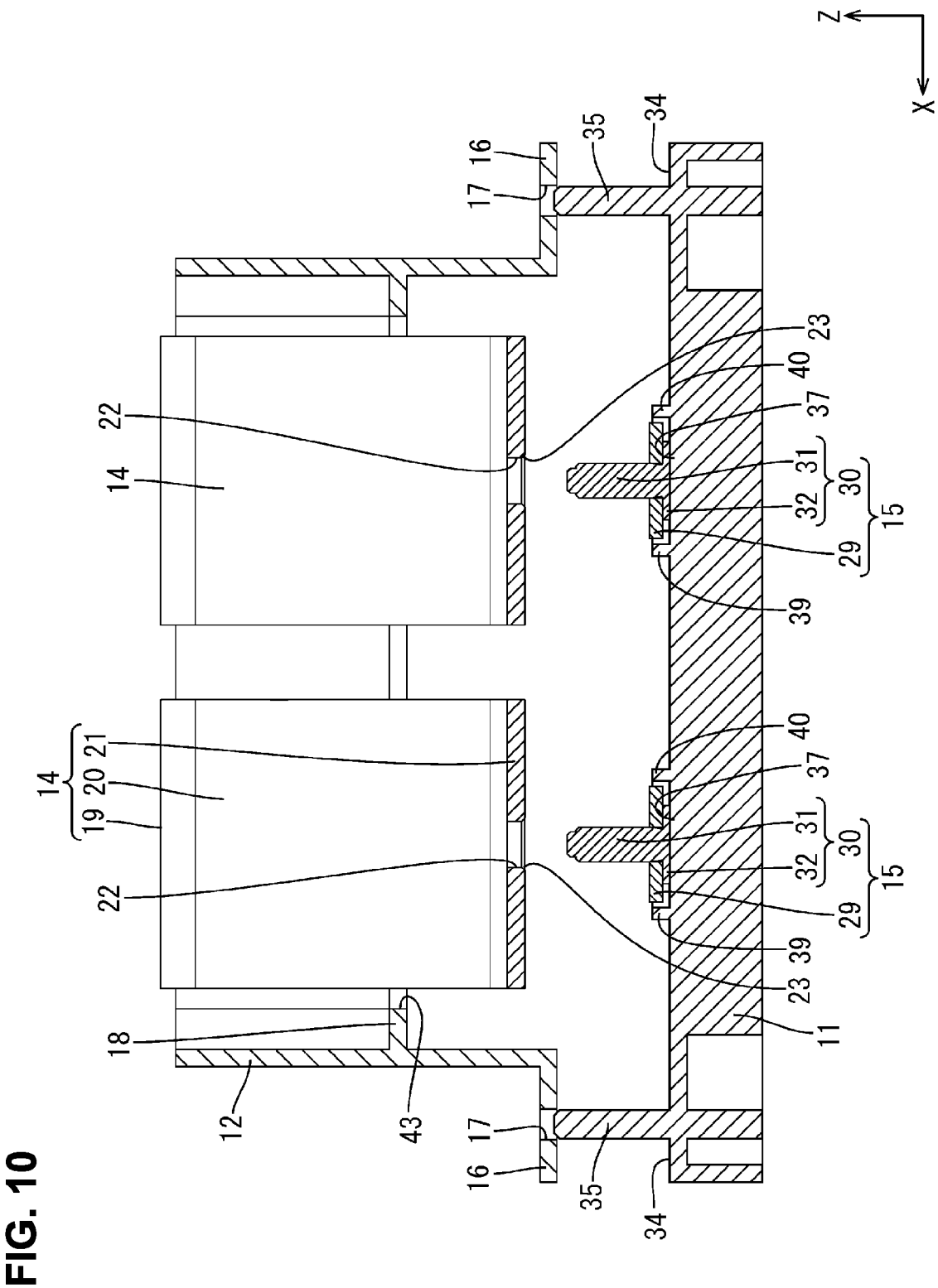
FIG. 10 is a cross-sectional view cut along a line corresponding to line B-B in FIG. 4, illustrating a process of attaching an upper case to the lower case.
Figure 11:
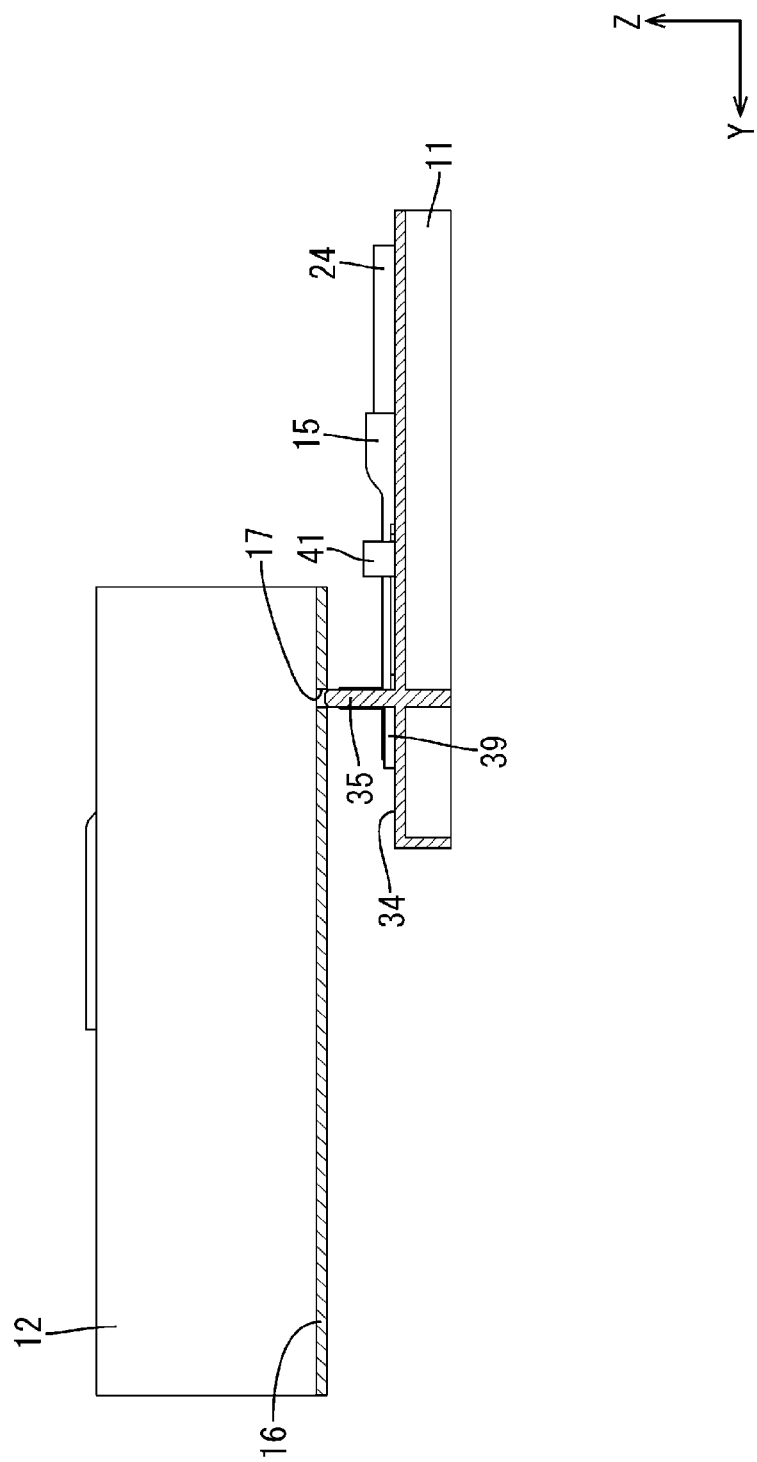
FIG. 11 is a cross-sectional view cut along a line corresponding to line C-C in FIG. 4, illustrating the process of attaching the upper case to the lower case.
Figure 12:
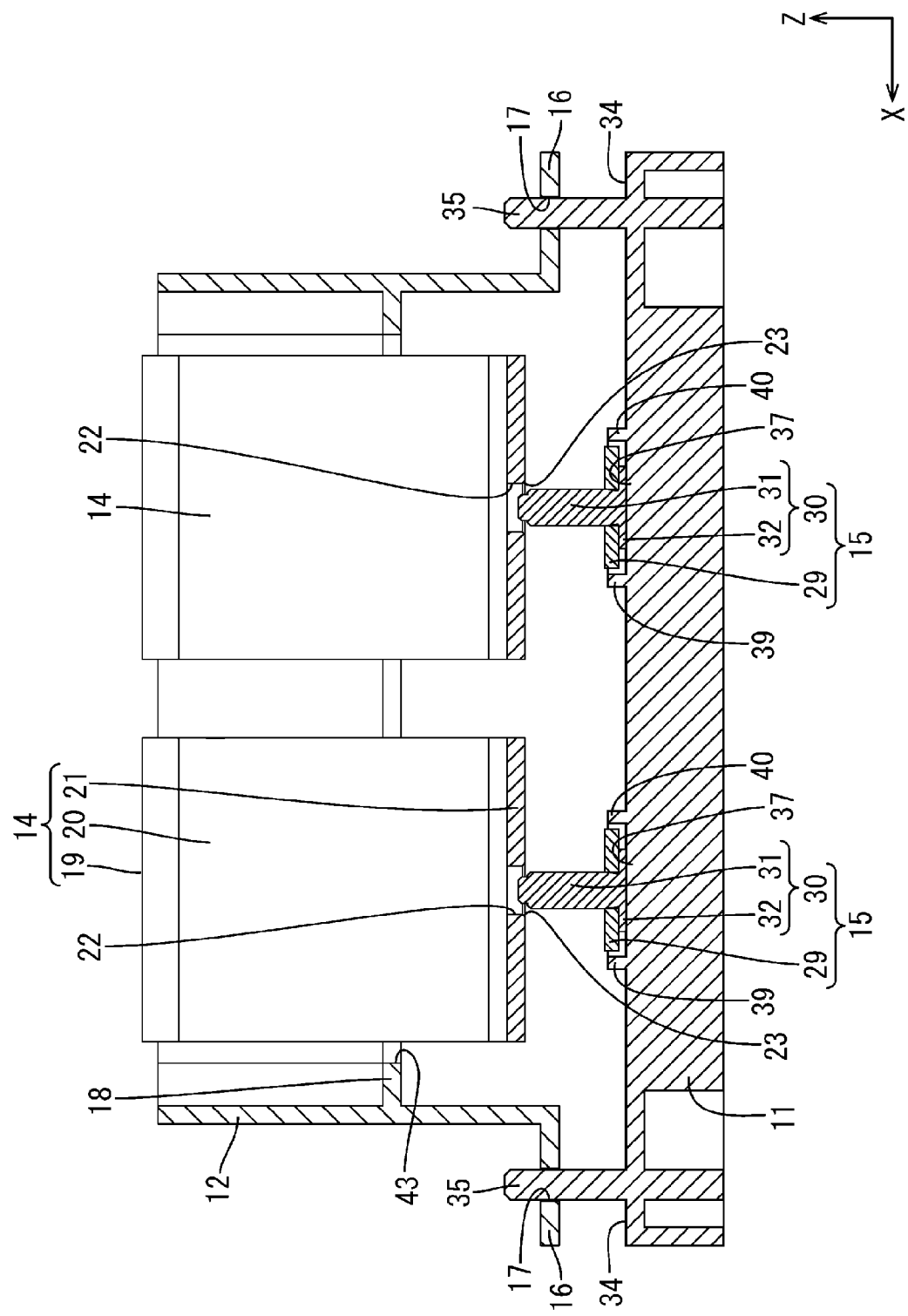
FIG. 12 is a cross-sectional view cut along a line corresponding to line B-B in FIG. 4, illustrating a process in which bolts are inserted into through holes.

The upper case 12 is moved toward the lower case 11 from above. As illustrated in FIG. 10, the case positioning portions 35 of the lower case 11 and the positioning holes 17 of the upper case 12 are aligned. In a state in which the case positioning portions 35 and the positioning holes 17 are aligned, the upper case 12 is moved closer to the lower case 11.

Due to the upper case 12 being moved further downward, the tips of the bolts 30 come into contact with the tapered surfaces 23 formed in the hole edge portions of the through holes 22 in the bus bars 14 from below. Then, due to the bolts 30 being guided by the tapered surfaces 23, the terminals 15 move relative to the bus bars 14, and the bolts 30 of the terminals 15 and the through holes 22 in the bus bars 14 are aligned (see FIG. 12).

Figure 13:
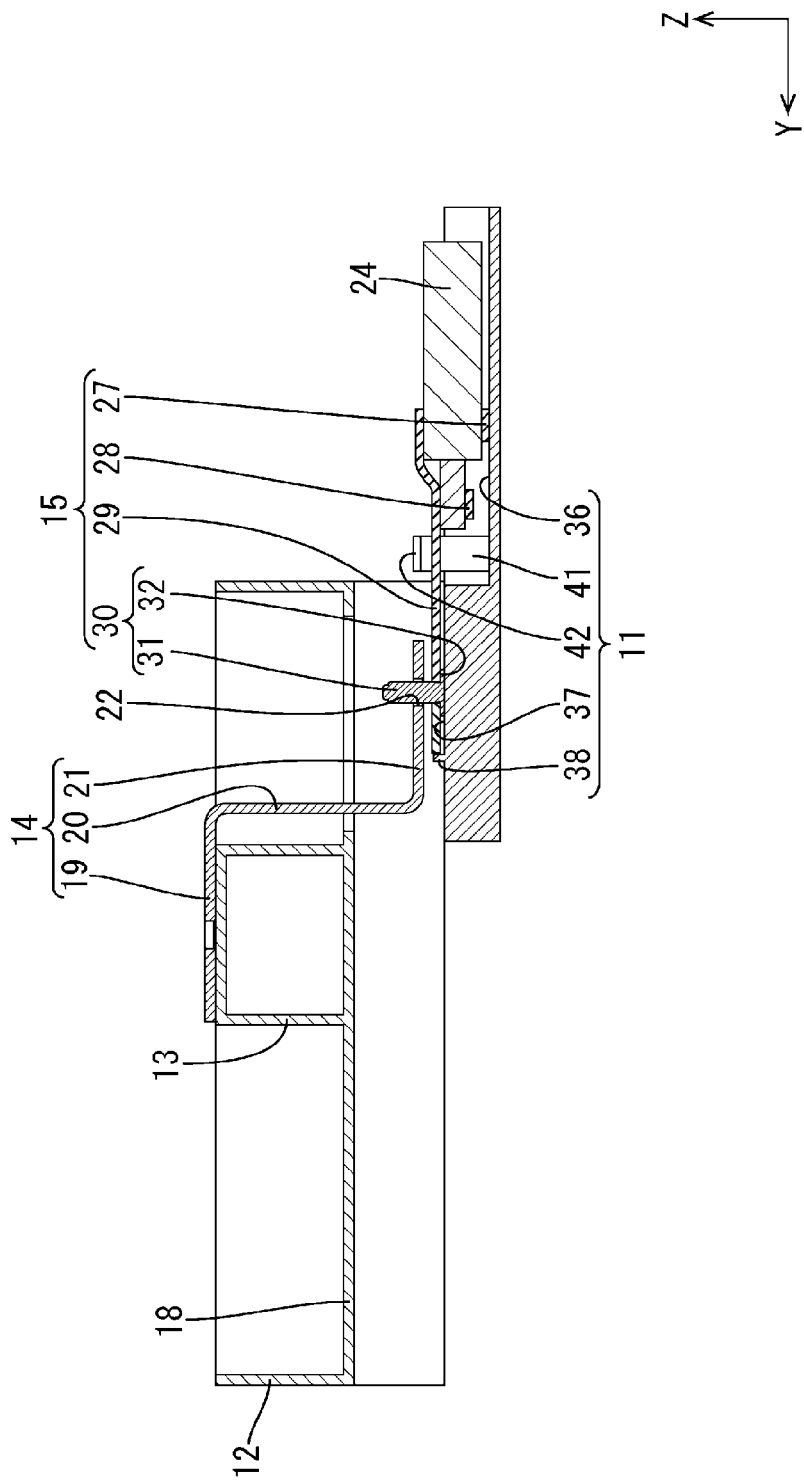
FIG. 13 is a cross-sectional view cut along a line corresponding to line A-A in FIG. 4, illustrating a state in which flanges of the upper case have been mounted on flange mounting portions of the lower case.

By moving the upper case 12 even closer to the lower case 11, the flanges 16 of the upper case 12 are mounted on the flange mounting portions 34 of the lower case 11 (see FIG. 13). In the state in which the flanges 16 have been mounted on the flange mounting portions 34, the bus bars 14 and the plate portions 29 of the terminals 15 are separated from one another in the top-bottom direction.

Figure 14:
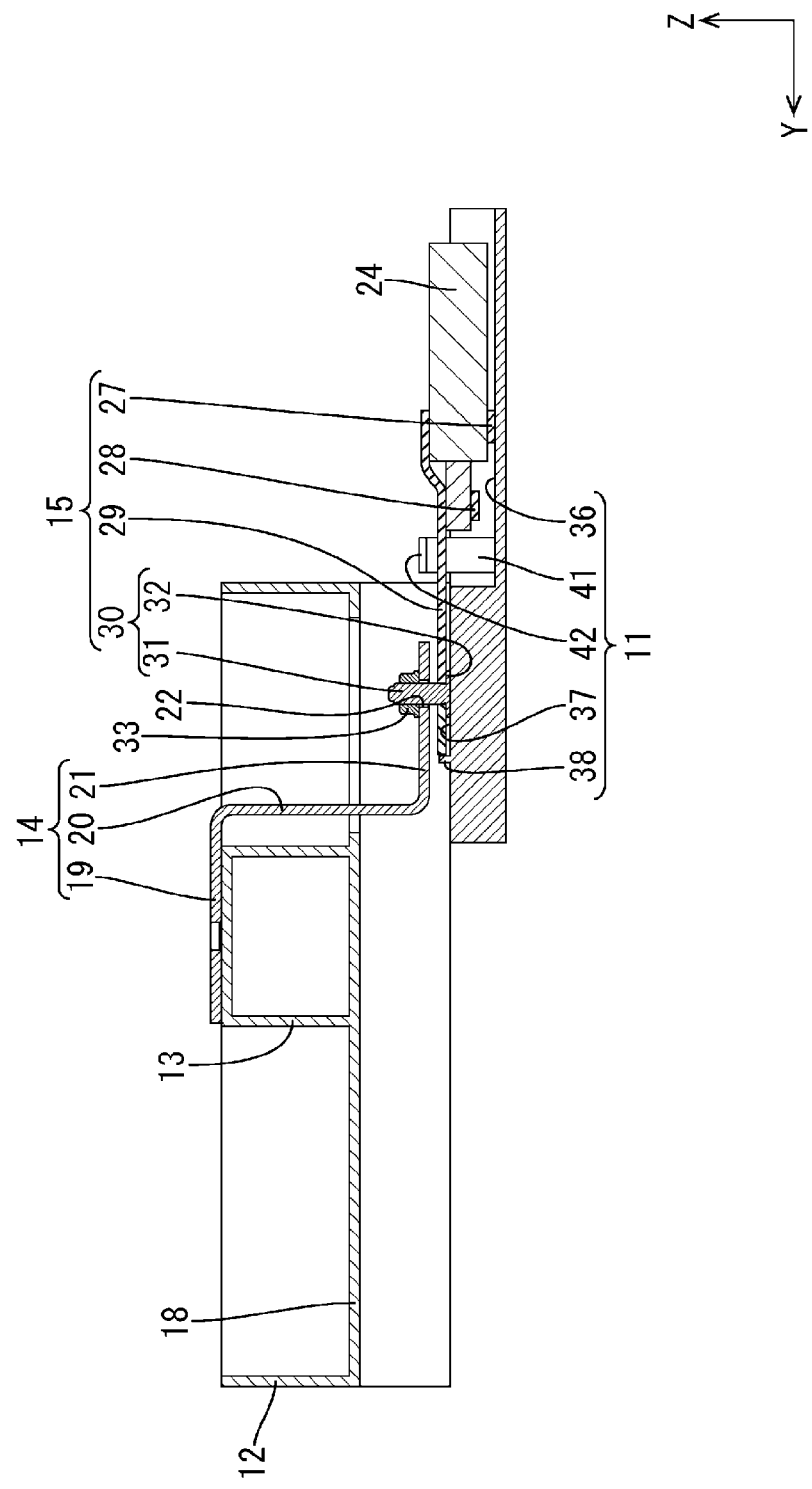
FIG. 14 is a cross-sectional view cut along a line corresponding to line A-A in FIG. 4, illustrating a process of screwing nuts onto shaft portions of the bolts.

As illustrated in FIG. 14, the nuts 33 are screwed onto the tips of the shaft portions 31 of the bolts 30. By turning the nuts 33 using a torque wrench or the like, the plate portions 29 fixed to the bolts 30 move upward, and the plate portions 29 are separated from the terminal mounting portions 37. By fastening the nuts 33 and the bolts 30 together by means of a predetermined fastening force, the bus bars 14 are sandwiched between the nuts 33 and the plate portions 29 (see FIG. 5). Thus, the bus bars 14 and the terminals 15 are electrically connected. In the state in which the bus bars 14 have been sandwiched between the nuts 33 and the plate portions 29 of the terminals 15, the plate portions 29 of the terminals 15 are separated from the terminal mounting portions 37. Furthermore, the side edges of the plate portions 29 of the terminals 15 are positioned higher than the upper ends of the front walls 38, the upper ends of the left walls 39, and the upper ends of the right walls 40. Thus, in the state in which the bus bars 14 have been sandwiched between the nuts 33 and the plate portions 29 of the terminals 15, the plate portions 29 of the terminals 15 are separated from the front walls 38, the left walls 39, and the right walls 40. In such a manner, the assembly of the circuit structure 10 is completed.

Operations and Effects of Present Embodiment

Next, the operations and effects of the present embodiment will be described. The circuit structure 10 pertaining to the present embodiment includes: an upper case 12 having positioning holes 17; bus bars 14 that are provided in an inductor 13 disposed in the upper case 12 and that have through holes 22; terminals 15 that are connected to electric wires 24 and that have bolts 30 disposed thereon that penetrate the through holes 22; nuts 33 that sandwich the bus bars 14 between the nuts 33 and the terminals 15 by being screwed onto the bolts 30; and a lower case 11 that is attached to the upper case 12. The lower case 11 includes: front walls 38, left walls 39, and right walls 40 that project upward from the lower case 11 and position the terminals 15 relative to the lower case 11 by contacting the terminals 15; and case positioning portions 35 that project upward from the lower case 11 and that are inserted into the positioning holes 17.

According to the above-described configuration, by mounting the lower case 11 so that the terminals 15 contact at least one of the front walls 38, the left walls 39, and the right walls 40, the terminals 15 and the lower case 11 can be positioned relative to one another. Here, after the terminals 15 are mounted on the lower case 11, the terminals 15 and the lower case 11 are positioned relative to one another due to the front end of each terminal 15 being positioned inside a space surrounded by a front wall 38, a left wall 39, and a right wall 40.

Furthermore, the lower case 11 and the upper case 12 can be positioned relative to one another by inserting the case positioning portions 35 of the lower case 11 into the positioning holes 17 in the upper case 12. Thus, the bolts 30 of the terminals 15 that have been positioned relative to the lower case 11 and the through holes 22 in the bus bars 14 provided in the inductor 13 disposed in the upper case 12 can be easily positioned relative to one another.

By screwing the nuts 33 onto the bolts 30 in a state in which the bolts 30 penetrate the through holes 22, the terminals 15 and the nuts 33 move relatively closer to one another. The terminals 15 having the bolts 30 disposed thereon can move easily since the terminals 15 are connected to the electric wires 24. Thus, due to the terminals 15 moving, the terminals 15 and the bus bars 14 can be fastened using bolts while suppressing warping of the bus bars 14 and the terminals 15, even if gaps are formed between the bus bars 14 and the terminals 15. Consequently, the positioning of the terminals 15 and the bus bars 14 relative to one another can be easily performed without increasing the dimensional accuracy of the components forming the circuit structure 10.

Furthermore, according to the present embodiment, in a state in which the nuts 33 have been screwed onto the bolts 30, the terminals 15 are separated from the front walls 38, the left walls 39, and the right walls 40.

According to the above-described configuration, a situation in which abnormal noise is generated due to the terminals 15 and the front walls 38, the left walls 39, and the right walls 40 coming into contact with each other due to vibration can be suppressed.

Furthermore, according to the present embodiment, the lower case 11 has locking portions 41 projecting from the lower case 11, and the locking portions 41 have facing portions 42 facing the terminals 15.

According to the above-described configuration, the terminals 15 and the facing portions 42 come into contact with each other if the terminals 15 receive a force in the direction away from the lower case 11. Thus, the terminals 15 are suppressed from moving higher than the position where the facing portions 42 are provided.

Furthermore, according to the present embodiment, tapered surfaces 23 are formed at the hole edge portions of the through holes 22 on the surfaces of the bus bars 14 facing the terminals 15.

According to the above-described configuration, the bolts 30 are guided to the inside of the through holes 22 due to the tips of the bolts 30 contacting the tapered surfaces 23. Thus, the terminals 15 and the bus bars 14 can be more easily positioned relative to one another.

Other Embodiments

The technique disclosed in the present specification is not limited to the embodiment that has been explained based on the description above and the drawings, and embodiments such as those described below, for example, are also included in the technical scope of technique disclosed in the present specification.

(1) In the present embodiment, the upper case 12 generally has the shape of a frame. However, the shape of the upper case 12 is not limited to this, and for example, the upper case 12 may have the shape of a box that is open downward, and the shape of the upper case 12 can be chosen as desired.

(2) The device is not limited to the inductor 13, and a desired electronic component, such as a semiconductor switching element or a capacitor, may be chosen as the device.

(3) The front walls 38, the left walls 39, and the right walls 40 may remain in contact with the terminals 15 even after the nuts 33 are fastened onto the bolts 30.

(4) The tapered surfaces 23 provided in the bus bars 14 may be omitted.

(5) The electric wires 24 may be naked electric wires.

(6) In the present embodiment, the case positioning portions 35 are formed integrally with the lower case 11 by injection-molding a synthetic resin. However, there is no limitation to this, and the lower case 11 may be formed by insert-molding case positioning portions 35 made of a metal.

(7) The electric wires 24 are not limited to having a circular cross-sectional shape, and a desired shape, such as an elliptical shape or a rectangular shape, can be adopted as the cross-sectional shape of the electric wires 24.

(8) The number of terminals 15 and the number of bus bars 14 may be one or three or more.

LIST OF REFERENCE NUMERALS

10 Circuit structure
11 Lower case
12 Upper case
13 Inductor (example of device)
14 Bus bar
15 Terminal
17 Positioning hole
22 Through hole
23 Tapered surface
24 Electric wire
30 Bolt
33 Nut
35 Case positioning portion
38 Front wall (example of terminal positioning portion)
39 Left wall (example of terminal positioning portion)
40 Right wall (example of terminal positioning portion)
41 Locking portion
42 Facing portion

The invention claimed is:

1. A circuit structure comprising:
an upper case having positioning holes;
a bus bar that is provided in a device disposed in the upper case and that has a through hole;
a terminal that is connected to an electric wire and that has a bolt disposed thereon that penetrates the through hole;
a nut that sandwiches the bus bar between the nut and the terminal by being screwed onto the bolt; and
a lower case that is attached to the upper case,
wherein the lower case includes: a terminal positioning portion that projects upward from the lower case and positions the terminal relative to the lower case by coming into contact with the terminal; and case positioning portions that project upward from the lower case and that are inserted into the positioning holes.

2. The circuit structure according to claim 1, wherein in a state in which the nut has been screwed onto the bolt and the bus bar has been sandwiched between the nut and the terminal, the terminal is separated from the terminal positioning portion.

3. The circuit structure according to claim 1, wherein the lower case has locking portions projecting from the lower case, and the locking portions have facing portions that face the terminal.

4. The circuit structure according to claim 1, wherein a tapered surface is formed at a hole edge portion of the through hole on a surface of the bus bar that faces the terminal.

* * * * *